US010056424B2

United States Patent
Kasai

(10) Patent No.: US 10,056,424 B2
(45) Date of Patent: Aug. 21, 2018

(54) SEMICONDUCTOR DEVICE, ELECTRICAL DEVICE SYSTEM, AND METHOD OF PRODUCING SEMICONDUCTOR DEVICE

(71) Applicant: LAPIS SEMICONDUCTOR CO., LTD., Kanagawa (JP)

(72) Inventor: Hiroki Kasai, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 0 days.

(21) Appl. No.: 15/814,606

(22) Filed: Nov. 16, 2017

(65) Prior Publication Data

US 2018/0076254 A1    Mar. 15, 2018

Related U.S. Application Data

(63) Continuation of application No. 15/283,484, filed on Oct. 3, 2016, now Pat. No. 9,853,081, which is a
(Continued)

(51) Int. Cl.
*H01L 27/12*    (2006.01)
*H01L 27/146*   (2006.01)
(Continued)

(52) U.S. Cl.
CPC ...... *H01L 27/14658* (2013.01); *H01L 21/743* (2013.01); *H01L 23/481* (2013.01);
(Continued)

(58) Field of Classification Search
None
See application file for complete search history.

(56) References Cited

U.S. PATENT DOCUMENTS 5,786,616 A    7/1998  Fukumoto
6,303,414 B1  10/2001  Ang et al.
(Continued)

FOREIGN PATENT DOCUMENTS

JP   H11-074523 A   3/1999
JP   2001-110810 A  4/2001
(Continued)

*Primary Examiner* — Benjamin Sandvik
*Assistant Examiner* — Herve Assouman
(74) *Attorney, Agent, or Firm* — Kubotera & Associates, LLC

(57) ABSTRACT

A semiconductor device includes an SOI substrate formed of a first semiconductor layer having a first conductive type, an embedded oxide film, and a circuit layer; and an interlayer insulation film formed on the SOI substrate. The SOI substrate has a circuit element region and an outer circumferential region surrounding the circuit element region. The circuit layer includes a plurality of single pixel circuits arranged in an array pattern. The single pixel circuit includes a circuit element, a diode, and a conductive portion. The diode includes a first region formed on the first semiconductor layer and a first conductive member formed on the interlayer insulation film and electrically connected to the first region. The conductive portion is electrically isolated from other elements. The conductive portion includes a second region formed on the first semiconductor layer and an electrode formed on the interlayer insulation film.

4 Claims, 11 Drawing Sheets

Related U.S. Application Data continuation of application No. 14/178,370, filed on Feb. 12, 2014, now Pat. No. 9,484,472.

(51) Int. Cl.
  *H01L 23/535* (2006.01)
  *H01L 31/02* (2006.01)
  *H01L 23/48* (2006.01)
  *H01L 21/74* (2006.01)

(52) U.S. Cl.
  CPC ........ *H01L 23/535* (2013.01); *H01L 27/1203* (2013.01); *H01L 27/1463* (2013.01); *H01L 27/14612* (2013.01); *H01L 27/14636* (2013.01); *H01L 27/14689* (2013.01); *H01L 31/02005* (2013.01); *H01L 27/14676* (2013.01); *H01L 2924/0002* (2013.01)

(56) References Cited

U.S. PATENT DOCUMENTS

| | | | |
|---|---|---|---|
| 7,718,503 | B2 | 5/2010 | Pellela |
| 2002/0000579 | A1 | 1/2002 | Aoyama |
| 2005/0269642 | A1 | 12/2005 | Minami |
| 2006/0125038 | A1 | 6/2006 | Mabuchi |
| 2006/0226485 | A1 | 10/2006 | Arakawa |
| 2007/0156891 | A1 | 7/2007 | Maki |
| 2008/0036002 | A1 | 2/2008 | Kishiro |
| 2008/0203452 | A1 | 8/2008 | Moon et al. |
| 2009/0108389 | A1 | 4/2009 | Inoue |
| 2010/0244173 | A1 | 9/2010 | Wang |
| 2011/0216212 | A1 | 9/2011 | Watanabe et al. |
| 2012/0086079 | A1* | 4/2012 | Kasai ................. H01L 27/14607 257/347 |
| 2012/0104523 | A1 | 5/2012 | Ikeda |
| 2015/0126002 | A1 | 5/2015 | Arai |

FOREIGN PATENT DOCUMENTS

| | | |
|---|---|---|
| JP | 2006-294719 A | 10/2006 |
| JP | 2007-184449 A | 7/2007 |
| JP | 2008-042046 A | 2/2008 |
| JP | 2010-232555 A | 10/2010 |
| WO | 2011/111754 A1 | 9/2011 |

* cited by examiner

SEMICONDUCTOR DEVICE, ELECTRICAL DEVICE SYSTEM, AND METHOD OF PRODUCING SEMICONDUCTOR DEVICE

CROSS-REFERENCE TO RELATED APPLICATIONS

This is a continuation application of a prior application Ser. No. 15/283,484, filed on Oct. 3, 2016, allowed, which is a continuation application of a prior application Ser. No. 14/178,370, filed on Feb. 12, 2014, issued as U.S. Pat. No. 9,484,472 on Nov. 1, 2016.

BACKGROUND OF THE INVENTION AND RELATED ART STATEMENT

The present invention relates to a semiconductor device, an electrical device system including the semiconductor device, and a method of producing the semiconductor device.

Patent Reference has disclosed a conventional semiconductor device, in which a photodiode sensor and a control circuit transistor are formed on a semiconductor substrate with an insulation film in between.

Patent Reference: Japanese Patent Publication No. 2010-232555

An example of the conventional semiconductor device will be explained with reference to FIGS. 14 and 15. FIG. 14 is a schematic plan view showing an example of a configuration of a conventional semiconductor device 900. FIG. 15 is a schematic sectional view showing the example of the configuration of the conventional semiconductor device 900. The conventional semiconductor device 900 includes a diode 905 and a MOS-type transistor 904 formed on an SOI (Silicon On Insulation) substrate. The conventional semiconductor device 900 is configured to function as a sensor for detecting an X-ray and the like.

As shown in FIG. 14, in a plan view showing the configuration of the conventional semiconductor device 900, a substrate contact portion 902 is arranged on a periphery of the conventional semiconductor device 900, and a circuit element region 903 including a sensor is disposed inside the substrate contact portion 902. It should be noted that the substrate contact portion 902 includes N-type drawing out electrode regions 910 and 911 (described later) and electrodes 920 and 921 (described later) connected to the N-type drawing electrode regions 910 and 911, respectively. In FIG. 14, an electrode with a ring shape including the electrode 920 and 921 is shown as a part of the substrate contact portion 902.

As shown in FIG. 15, the conventional semiconductor device 900 includes the SOI substrate including an N-type semiconductor layer 907, an embedded oxide film 909, and a P-type semiconductor layer 908. Further, the MOS-type transistor 904 and the like are disposed in the P-type semiconductor layer 908 in the embedded oxide film 909 for performing a circuit operation. Further, the diode 905 as the sensor is formed in the N-type semiconductor layer 907 arranged below the embedded oxide film 909. It should be noted that the diode 905 may be referred to as a pixel, and the configuration including a periphery circuit element having the MOS-type transistor 904, a resistor, a capacitor, and the like; the diode 905 (a plural in general); and the like may be referred to as a single pixel circuit (a single pixel circuit 906 in FIG. 15). As described above, the conventional semiconductor device 900 has the configuration, in which the periphery circuit element and the sensor are integrated on one single substrate.

Further, as shown in FIG. 15, in the vertical sectional view showing the configuration of the substrate contact portion 902, the substrate contact portion 902 includes the N-type drawing electrode regions 910 and 911 and the electrodes 920 and 921 connected to the N-type drawing out electrode regions 910 and 911, respectively. A positive potential of a power source 904 is connected to the electrodes 920 and 921. The diode 905 includes a P-type drawing out electrode region 912 and an electrode 922 connected to the P-type drawing electrode regions 912. A negative potential of the power source 904 is grounded (GND) and connected to the electrode 922.

In the conventional semiconductor device 900 described above, the positive potential of the power source 924 is connected also to a bottom surface of the N-type semiconductor layer 907 (a surface opposite to the surface where the embedded oxide film 909 is formed) through an electrode (not shown). When the power source 924 applies a reverse bias of a few hundred volt to a PN connection (a junction) formed with the P-type drawing out electrode region 912 and the N-type semiconductor layer 907, a depletion layer spreads in the N-type semiconductor layer 907, thereby increasing detection sensitivity when an X-ray and the like is incidents on the conventional semiconductor device 900.

Further, when the power source 924 applies the reverse bias to the PN connection, the substrate contact portion 902 applies a bias to the N-type semiconductor layer 907, so that the substrate contact portion 902 restricts the depletion layer from spreading. More specifically, the N-type drawing out electrode regions 910 and 911 have an N-type impurity having a concentration greater than a concentration of the N-type impurity in the N-type semiconductor layer 907. Accordingly, the spreading of the depletion layer is restricted in the N-type drawing electrode regions 910 and 911. As a result, the substrate contact portion 902 also functions as a guard ring for preventing the depletion layer from reaching an edge surface of the conventional semiconductor device 900 after pelletizing (cutting into a chip piece).

In general, it is difficult to use a collection lens or a collection mirror in the X-ray sensor due to the fact that an X-ray has a small reflective index variance or a small reflection rate. Accordingly, in the X-ray sensor, it is possible to use only a simple optical system. As a result, it is necessary to provide the X-ray sensor with a large area for capturing a large image, so that the circuit element region 903 tends to be enlarged.

As described above, in the conventional semiconductor device 900, an N-type substrate contact portion having the same polarity as that of the N-type semiconductor layer 907 is not disposed in the substrate contact portion 902. Accordingly, especially when the area of the circuit element region 903 is increased to enlarge the area of the sensor, it is difficult to secure an escaping path of charges of plasma generated during a plasma etching process when a contact hole and a laminated metal are etched through the plasma etching process when a multilayer wiring portion is formed. Further, it is difficult to secure an escaping path of a surge electrical current. Accordingly, if arc discharge occurs during a via (a through electrode) forming step or a metal etching step in a wafer manufacturing process, it is difficult to secure the escaping path of the surge electrical current, and a significant damage may be occurred in a wafer.

To this end, the N-type substrate contact portion may be disposed in the circuit element region 903, so that the N-type substrate contact portion functions as the escaping path of charges of the plasma. However, when the potential of the N-type substrate contact portion is fixed to the ground potential, the N-type substrate contact portion is connected to the substrate contact portion 902 having the N-type drawing out electrode region 910 and the N-type drawing out electrode region 911 through the N-type semiconductor layer 907. Accordingly, an unnecessary electrical current may be generated from the substrate contact portion 902, to which the power source 924 applies the positive potential, to the N-type substrate contact portion thus grounded.

Further, when the positive potential of the power source 924 is connected to the N-type substrate contact portion to apply the positive bias thereto, a breakdown may occur between the P-type drawing out electrode region 912 and the N-type substrate contact portion when the depletion layer of the PN connection formed with the P-type drawing out electrode region 912 and the N-type semiconductor layer 907 reaches the N-type substrate contact portion. Accordingly, an unnecessary electrical current may be generated. For the reasons described above, it is difficult to apply the potential to the N-type substrate contact portion.

Further, when the PN connection formed with the P-type drawing out electrode region 912 and the N-type semiconductor layer 907 has a low voltage tolerance, it may be possible to flow charges through the breakdown of the PN connection when charges of the plasma flow through during the plasma etching process. However, the N-type semiconductor layer 907 is formed of a substrate having a high voltage tolerance, so that the entire portion of the N-type semiconductor layer 907 can become the depletion layer. Accordingly, the PN connection formed with the P-type drawing out electrode region 912 and the N-type semiconductor layer 907 tends to have a high voltage tolerance of, for example, a few thousands volts. Accordingly, it is difficult to utilize the PN connection formed with the P-type drawing out electrode region 912 and the N-type semiconductor layer 907 as the escaping path of charges.

In view of the problems described above, an object of the present invention is to provide a semiconductor device, an electrical device system including the semiconductor device, and a method of producing the semiconductor device capable of solving the problems of the conventional electrical device. In the present invention, it is possible to prevent damage caused by an external charge while suppressing an unnecessary leak electrical current.

Further objects and advantages of the invention will be apparent from the following description of the invention.

SUMMARY OF THE INVENTION

In order to attain the objects described above, according to a first aspect of the present invention, a semiconductor device includes a first semiconductor layer having a first conductive type; a circuit layer including a second semiconductor layer; and a plurality of layered members. Each of the layered members includes an interlayer insulation film and a wiring layer formed on the interlayer insulation film. The circuit layer is formed on one main surface of the first semiconductor layer. The second semiconductor layer includes a circuit element and has a second conductive type opposite to the first conductive type.

According to the first aspect of the present invention, the layered members are configured to form a multilayer wiring layer, so that the interlayer insulation film of one of the layered members at the lowest position is situated on the circuit layer; the interlayer insulation film of the other of the layered members is situated on the wiring layer of the layered member at a lower position; and the wiring layer of a specific one of the layered members is connected to the circuit element.

According to the first aspect of the present invention, the semiconductor device further includes a penetrating conductive member; a conductive portion; and a first conductive type region formed on the one main surface of the first semiconductor layer and connected to the conductive portion.

According to the first aspect of the present invention, the penetrating conductive member is disposed to penetrate from the one main surface of the first semiconductor layer to a surface of the interlayer insulation film of the layered member at the highest position of the multilayer wiring layer through the circuit layer and the multi layer wiring layer. The conductive portion includes an electrode formed in the wiring layer of the layered member at the highest position of the multilayer wiring layer and connected to the penetrating conductive member. The conductive portion is configured to be electrically isolated from other portions. The first conductive type region has an impurity concentration greater than that of the first semiconductor layer.

According to a second aspect of the present invention, a semiconductor device includes a first semiconductor layer having a first conductive type; an insulation member layer formed on one main surface of the first semiconductor layer; a second semiconductor layer; a circuit element formed in the second semiconductor layer; and a plurality of layered members. Each of the layered members includes an interlayer insulation film and a wiring layer formed on the interlayer insulation film. The second semiconductor layer is formed in the insulation member layer and has a second conductive type opposite to the first conductive type.

According to the second aspect of the present invention, the layered members are configured to form a multilayer wiring layer, so that the interlayer insulation film of one of the layered members at the lowest position is situated on the circuit layer; the interlayer insulation film of the other of the layered members is situated on the wiring layer of the layered member at a lower position; and the wiring layer of a specific one of the layered members is connected to the circuit element.

According to the second aspect of the present invention, the semiconductor device further includes a multilayer wiring layer connected to the circuit element through a through electrode penetrating through the insulation member layer; a penetrating conductive member; a conductive portion; a first region formed on the one main surface of the first semiconductor layer and having the second conductive type; and a second region formed on the one main surface of the first semiconductor layer and having the first conductive type.

According to the second aspect of the present invention, the penetrating conductive member is disposed to penetrate from the one main surface of the first semiconductor layer to a surface of the interlayer insulation film of the layered member at the highest position of the multilayer wiring layer through the circuit layer and the multi layer wiring layer. The conductive portion includes an electrode formed in the wiring layer of the layered member at the highest position of the multilayer wiring layer and connected to the penetrating conductive member. The conductive portion is configured to be electrically isolated from other portions. The first conductive region is connected to the multi layer wiring layer through the through electrode penetrating through the insulation member layer. The second conductive type region is connected to the conductive portion, and has an impurity concentration greater than that of the first semiconductor layer.

According to a third aspect of the present invention, an electrical device system includes the semiconductor device in the first aspect or the second aspect of the present invention.

According to a fourth aspect of the present invention, a method of producing a semiconductor device includes a step of preparing a layered member including a first semiconductor layer having a first conductive type, an insulation member layer on one main surface of the first conductive layer, and a second semiconductor layer on the insulation member layer; and a step of forming a circuit element in the second semiconductor layer; a step of forming a first region and a second region on the one main surface of the first semiconductor layer. The first region has a second conductive type opposite to the first conductive type. The second region has the first conductive type and an impurity concentration greater than that of the first semiconductor layer.

According to the fourth aspect of the present invention, the method of producing the semiconductor device further includes a step of forming a first interlayer insulation film on the second semiconductor layer; and a step of forming a through hole in the insulation member layer and the first interlayer insulation film through a plasma etching process so that a plurality of first through electrodes is formed to connect the circuit element, the first region, and the second region.

According to the fourth aspect of the present invention, the method of producing the semiconductor device further includes a first wiring step of forming a wiring portion on the circuit element and the first region through a conductive portion on the first interlayer insulation film to connect to the first through electrodes so that the conductive portion is formed on the first interlayer insulation film and connected to the first through electrodes, and is electrically isolated from other portions; and a step of forming a second interlayer insulation film on the first interlayer insulation film and forming a through hole in the second interlayer insulation film through a plasma etching process so that a plurality of second through electrodes is formed to connect to the conductive portion connected to the circuit element, the first region, and the second region.

According to the fourth aspect of the present invention, the method of producing the semiconductor device further includes a second wiring step of forming a wiring portion on the circuit element and the first region through a conductive portion on the second interlayer insulation film to connect to the second through electrodes so that the conductive portion is formed on the second interlayer insulation film and connected to the second through electrodes, and is electrically isolated from other portions.

According to the present invention, it is possible to provide the semiconductor device, the method of producing the semiconductor device, and the electric device system including the semiconductor device capable of preventing damage due to external charge while suppressing a waste leak electrical current.

DETAILED DESCRIPTION OF PREFERRED EMBODIMENTS

Hereunder, preferred embodiments of the present invention will be explained with reference to the accompanying drawings.

First Embodiment

A semiconductor device 100 according to a first embodiment of the present invention will be explained. The semiconductor device 100 is capable of being configured as a sensor having sensitivity relative to an X-ray, a β-ray, visible light, and the like. In the following description, the semiconductor device 100 will be explained as an example that functions as an X-ray sensor.

Figure 1:
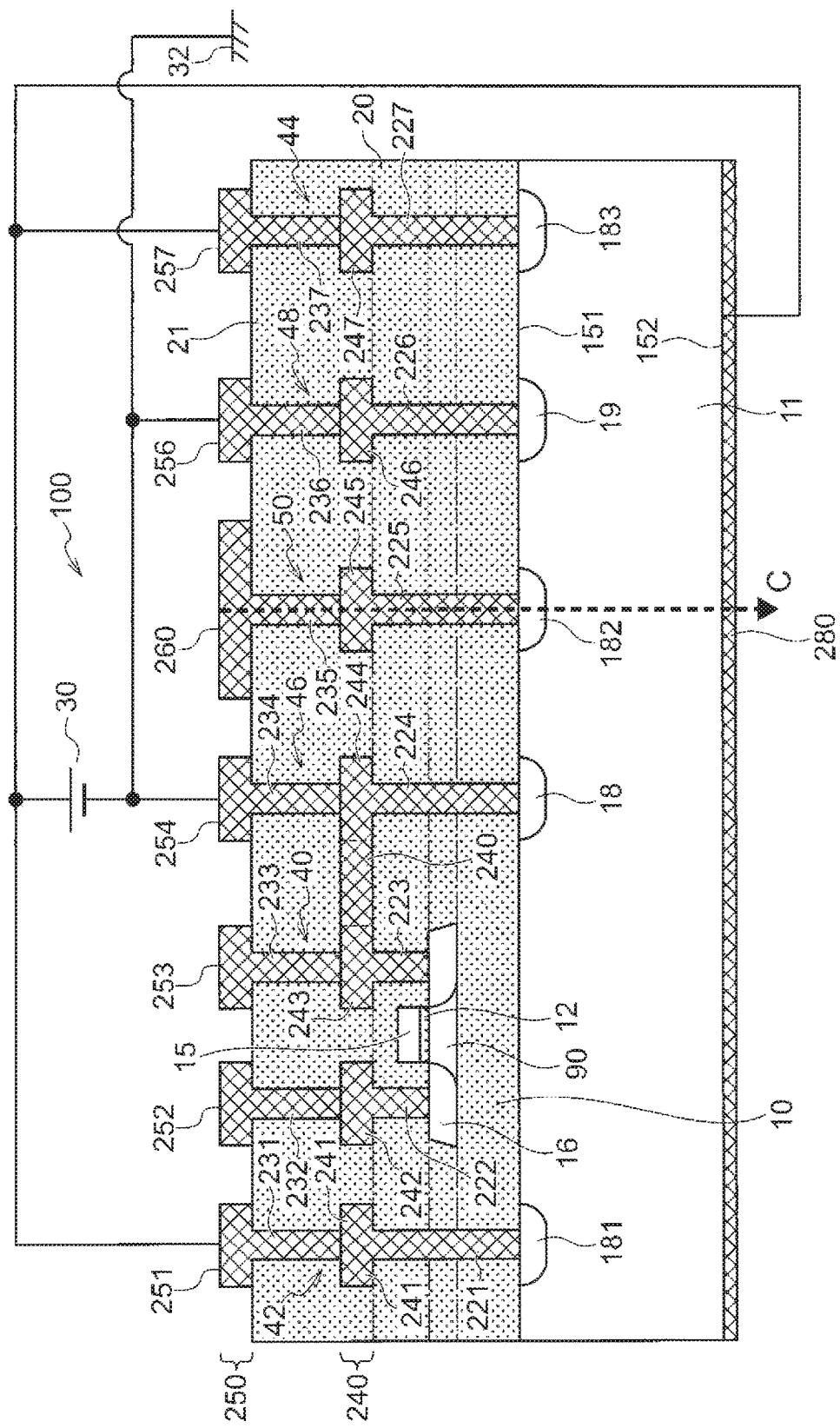
FIG. 1 is a schematic vertical sectional view showing a configuration of a semiconductor device according to a first embodiment of the present invention.
Figure 2:
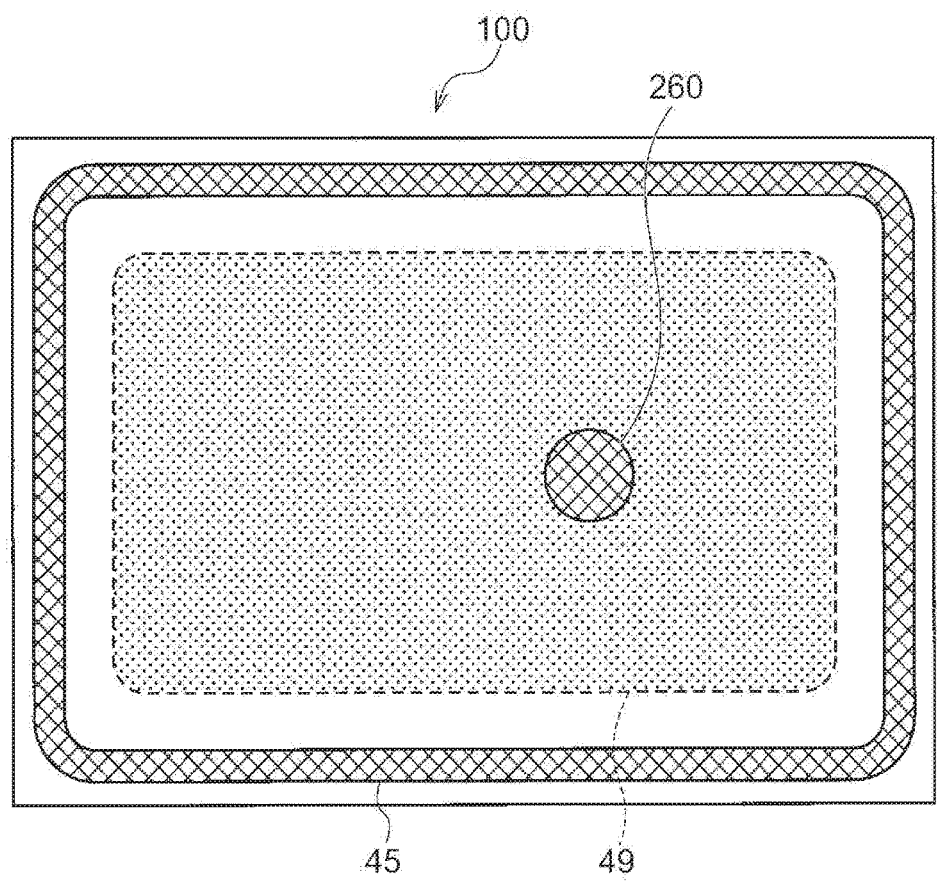
FIG. 2 is a schematic plan view showing the configuration of the semiconductor device according to the first embodiment of the present invention.

First, a configuration of the semiconductor device 100 will be explained with reference to FIGS. 1 and 2. FIG. 1 is a schematic vertical sectional view showing the configuration of the semiconductor device 100 according to the first embodiment of the present invention. Further, FIG. 2 is a schematic plan view showing the configuration of the semiconductor device 100 according to the first embodiment of the present invention.

As shown in FIG. 1, the semiconductor device 100 uses an SOI substrate formed of an embedded oxide film 10 laminated on an N-type semiconductor layer 11 and a P-type semiconductor layer 90 laminated on the embedded oxide film 10. The N-type semiconductor layer 11 is formed of an N-type silicon (Si) supporting substrate.

In the first embodiment, an insulation film 20 and an interlayer insulation film 21 are formed on the SOI substrate. The insulation film 20 is formed of the embedded oxide film 10, a field oxide film 22 (described later), and an interlayer film 25 (described later). Further, as an periphery circuit element, a MOS-type transistor (a filed effect transistor) 40, a diode 46, a diode 48, a first substrate contact portion 42, a first substrate contact portion 44, and a second substrate contact portion 50 are formed on the SOI substrate.

It should be noted that, in the first embodiment, a substrate contact portion collectively refers to a configuration including an N-type drawing out electrode region (described later) or a P-type drawing out electrode region (described later), so-called a substrate contact, in addition to a conductive member connected to the N-type drawing out electrode region or the P-type drawing out electrode region. Accordingly, the first substrate contact portion 42 and the first substrate contact portion 44 represent a partial section of a substrate contact portion 45 formed in a ring shape as shown in FIG. 2.

In the first embodiment, the MOS-type transistor 40 is configured to include the P-type semiconductor layer 90; an LDD (Lightly Doped Drain) region 16; a gate oxide film 12; a gate electrode 15; a first via 222; a first conductive member 242; a second via 232; a second conductive member 252; a first via 223; a first conductive member 243; a second via 233; and a second conductive member 253. The LDD region 16 is formed between a source, a drain, and a channel of the MOS-type transistor 40. Further, the first via 222, the first conductive member 242, the second via 232, the second conductive member 252 are connected to the drain of the MOS-type transistor 40. Further, the first via 223, the first conductive member 243, the second via 233, the second conductive member 253 are connected to the source of the MOS-type transistor 40.

In the first embodiment, the first conductive member 242 and the first conductive member 243 are a part of a first layer wiring portion 240 among multilayer wiring portions formed in the semiconductor device 100. Similarly, the second conductive member 252 and the second conductive member 253 are a part of a second layer wiring portion 250 among multilayer wiring portions formed in the semiconductor device 100. Other first conductive members and second conductive members are similarly configured.

In the first embodiment, the circuit elements formed in the semiconductor device 100 such as the MOS-type transistor 40, the diode 46, the diode 48, and the like are connected in a specific pattern with the first layer wiring portion 240 and the second layer wiring portion 250. For example, as shown in FIG. 1, the source of the MOS-type transistor 40 is connected to an anode of the diode 46. It should be noted that the circuit elements are not limited to the direct connection shown in FIG. 1, and may be connected through other circuit element such as a diode, a resistor, a capacitor, and the like.

In the first embodiment, the diode 46 is configured to include a P-type drawing out electrode region 18 formed on a main surface (a front surface) 151 of the N-type semiconductor layer 11 as a high concentration P-type region; a first via 224 connected to the P-type drawing out electrode region 18; a first conductive member 244; a second via 234; and a second conductive member 254. Further, the diode 48 is configured to include a P-type drawing out electrode region 19 formed on the main surface 151 of the N-type semiconductor layer 11 as a high concentration P-type region; a first via 226 connected to the P-type drawing out electrode region 19; a first conductive member 246; the second via 236; and the second conductive member 256. Accordingly, a diode portion for detecting an X-ray is formed through a PN connection between the P-type drawing out electrode region 18 and the N-type semiconductor layer 11, or a PN connection between the P-type drawing out electrode region 19 and the N-type semiconductor layer 11.

In the first embodiment, the first substrate contact portion 42 is configured to include an N-type drawing out electrode region 181 as a high concentration N-type impurity region higher than the N-type semiconductor layer 11; a first via 221 connected to the N-type drawing out electrode region 181; a first conductive member 241; the second via 231; and the second conductive member 251. Further, the first substrate contact portion 44 is configured to include an N-type drawing out electrode region 183 as a high concentration N-type impurity region higher than the N-type semiconductor layer 11; a first via 227 connected to the N-type drawing out electrode region 183; the first conductive member 247; the second via 237; and a second conductive member 257.

In the first embodiment, the second substrate contact portion 50 is configured to include an N-type drawing out electrode region 182 as a high concentration N-type impurity region higher than the N-type semiconductor layer 11; a first via 225 connected to the N-type drawing out electrode region 182; a first conductive member 245; the second via 235; and an electrode 260.

As shown in FIG. 2, the electrode 260 is disposed inside a circuit element region 49 surrounded with the substrate contact portion 45. It should be noted that the electrode 260 is not connected to any via or conductive member, and becomes a floating electrode. In the first embodiment, the position of the electrode 260 inside the circuit element region 49 is not limited to the configuration shown in FIG. 2, and it is preferred that the electrode 260 is disposed at the center of the circuit element region 49 in consideration of uniformity of the effect of the electrode 260. It is also noted that other second conductive members such as the second conductive member 252, the second conductive member 253, and the like connected to the MOS-type transistor 40 are not shown in FIG. 2.

In the first embodiment, a backside electrode 280 is disposed on a main surface 152 of the semiconductor device 100 opposite to the main surface 151 thereof. Similar to the N-type drawing out electrode region 181 and the N-type drawing out electrode region 183, the backside electrode 280 is configured to function as a cathode electrode of the diode 46 and the diode 48. However, it is possible to apply a bias to the diode 46 and the diode 48 only through the N-type drawing out electrode region 181 and the N-type drawing out electrode region 183. Accordingly, it is not necessary to provide the backside electrode 280 in the first embodiment.

As shown in FIG. 1, a power source 30 and a ground 32 are arranged to apply a bias to the semiconductor device 100. More specifically, the second conductive member 251 of the first substrate contact portion 42, the second conductive member 257 of the first substrate contact portion 44, and the backside electrode 280 are connected to a positive electrode of the power source 30. Accordingly, a positive voltage is applied to the N-type drawing out electrode region 181, the N-type drawing out electrode region 183, and the N-type semiconductor layer 11. It should be noted that the second conductive member 251 and the second conductive member 257 are configured to function as the cathode electrode of the diode 46 and the diode 48.

Further, the second conductive member 254 of the diode 46 and the second conductive member 256 of the diode 48 are connected to a negative electrode of the power source 30 and the ground 32. Accordingly, a ground potential is applied to the P-type drawing out electrode region 18 and the P-type drawing out electrode region 19. It should be noted that the second conductive member 254 and the second conductive member 256 are configured to function as the anode electrode of the diode 46 and the diode 48.

In the first embodiment, when the power source 30 applies a high voltage about 100 to 300 V through the bias path described above, the N-type semiconductor layer 11 constituting the diode 46 and the diode 48 for detecting an X-ray becomes depleted. It should be noted that the power source 30 is also connected to the second conductive member 252 connected to the drain of the MOS-type transistor 40, the second conductive member 253 connected to the source of the MOS-type transistor 40, and the gate electrode 15, so that a specific bias is applied according to functions thereof.

In the semiconductor device 100 according to the first embodiment, the first conductive member 245 of the second substrate contact portion 50 and the electrode 260 are not connected to any via or a metal wiring portion other than the second substrate contact portion 50. Accordingly, the second substrate contact portion 50 becomes the floating electrode in a region surrounded with the substrate contact portion 45 including the first substrate contact portion 42 and the first substrate contact portion 44.

In the first embodiment, when a surge electrical current is generated due to arc discharge and the like, it is possible to release the surge electrical current to the backside surface of the SOI substrate through the second substrate contact portion 50. As a result, it is possible to prevent the semiconductor device 100 from damaging. In other words, the second substrate contact portion 50 is configured to function as a lightning rod for the semiconductor device 100.

Further, as described above, in the first embodiment, it is configured such that the second substrate contact portion 50 becomes the floating electrode. Accordingly, even when the semiconductor device 100 is operating, it is possible to prevent a waste leak electrical current from being generated between the second substrate contact portion 50 and the substrate contact portion 45 or due to breakdown between the second substrate contact portion 50 and the diode 46 or the diode 48.

A method of producing the semiconductor device 100 will be explained next with reference to FIGS. 3 to 11. FIGS. 3 to 11 are schematic vertical sectional views No. 1 to No. 9 showing a manufacturing process of the semiconductor device 100 according to the first embodiment of the present invention.

Figure 3:
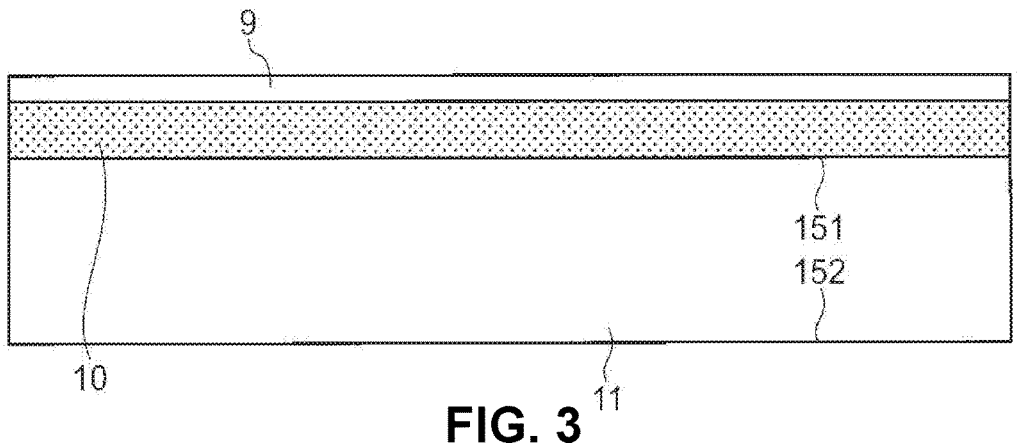
FIG. 3 is a schematic vertical sectional view No. 1 showing a manufacturing process of the semiconductor device according to the first embodiment of the present invention.

As shown in FIG. 3, first, the SOI substrate is produced. AS an example, the SOI substrate includes the embedded oxide film 10 having a thickness of about 200 nm; a P-type semiconductor layer 9 having a thickness of about 88 nm disposed on one side of the embedded oxide film 10; and the N-type semiconductor layer 11 having a thickness of about 700 μm disposed on the other side of the embedded oxide film 10. In this process, for example, the embedded oxide film 10 may be formed of a silicon dioxide ($SiO_2$) film. Further, the P-type semiconductor layer 9 may be formed of a P-type substrate having a relative resistivity of 10 Ω·cm, and the N-type semiconductor layer 11 may be formed of an N-type substrate having a relative resistivity of 10 Ω·cm.

Figure 4:
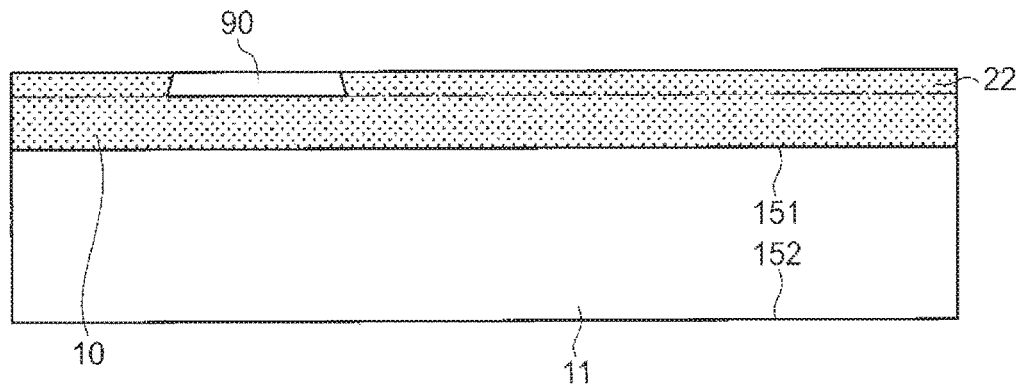
FIG. 4 is a schematic vertical sectional view No. 2 showing the manufacturing process of the semiconductor device according to the first embodiment of the present invention.

In the next step, a pad oxide ($SiO_2$) film is formed on a surface of the P-type semiconductor layer 9. Then, a silicon nitride ($Si_3N_4$) film (not shown) is formed on the pad oxide film through CVD and the like. After the silicon nitride film is etched and removed from an area where the field oxide film is to be formed, the field oxide film 22 is formed with an LOCOS (Local Oxidization of Silicon) method using the silicon nitride film as a mask. Accordingly, as shown in FIG. 4, the P-type semiconductor layer 90 is formed as an active region.

Figure 5:
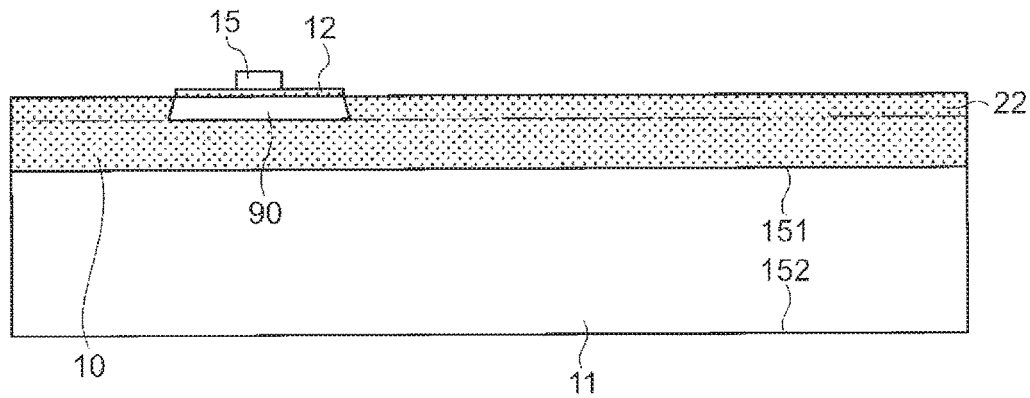
FIG. 5 is a schematic vertical sectional view No. 3 showing the manufacturing process of the semiconductor device according to the first embodiment of the present invention.

In the next step, the gate oxide film 12 is formed on the surface of the P-type semiconductor layer 90 and the field oxide film 22 (the entire upper surface shown in FIG. 4) through CVD and the like. Then, a poly-silicon film is deposited on the gate oxide film 12, and the poly-silicon film is patterned with photo resist. In the next step, the poly-silicon film is dry-etched (not shown), so that the gate electrode 15 is formed on the gate oxide film 12 of the P-type semiconductor layer 90 as shown in FIG. 5.

Figure 6:
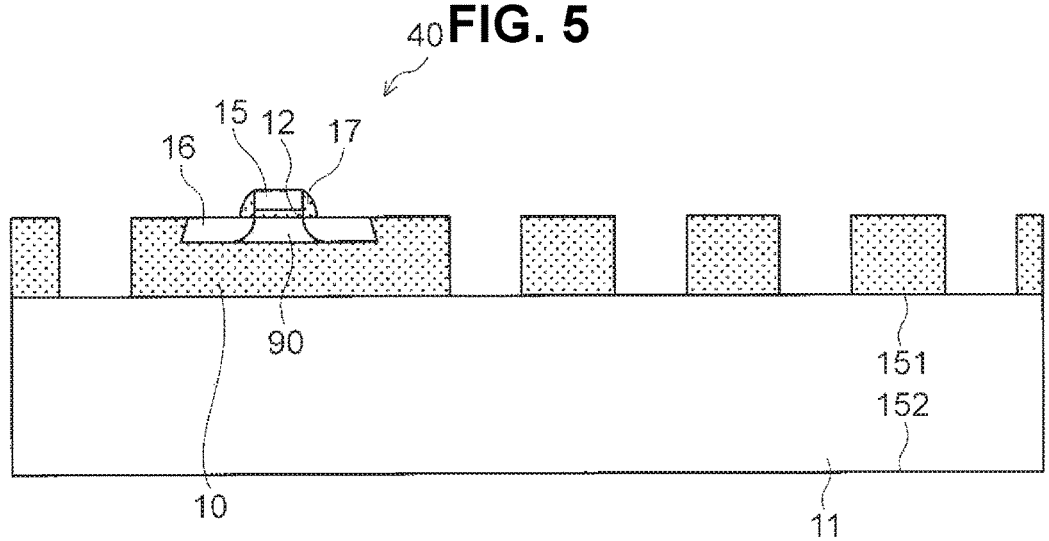
FIG. 6 is a schematic vertical sectional view No. 4 showing the manufacturing process of the semiconductor device according to the first embodiment of the present invention.

In the next step, after the photo resist is removed, as shown in FIG. 6, an impurity ion of the source and the drain is implanted at a low concentration to form the LDD region 16. Further, a sidewall spacer 17 is formed on a sidewall portion of the gate electrode 15. Afterward, the impurity ion of the drain is implanted at a high concentration to form the MOS-type transistor 40.

In the next step, after the MOS-type transistor 40 is formed, a photo resist is patterned on the field oxide film 22 to cover a region thereof other than a region corresponding to the N-type drawing out electrode region 181, the N-type drawing out electrode region 182, the N-type drawing out electrode region 183, the P-type drawing out electrode region 18, and the P-type drawing out electrode region 19 to be formed on the main surface 151 of the N-type semiconductor layer 11. Then, the field oxide film 22 and the N-type semiconductor layer 11 are etched with the photo resist as a mask, and the photo resist is removed.

Figure 7:
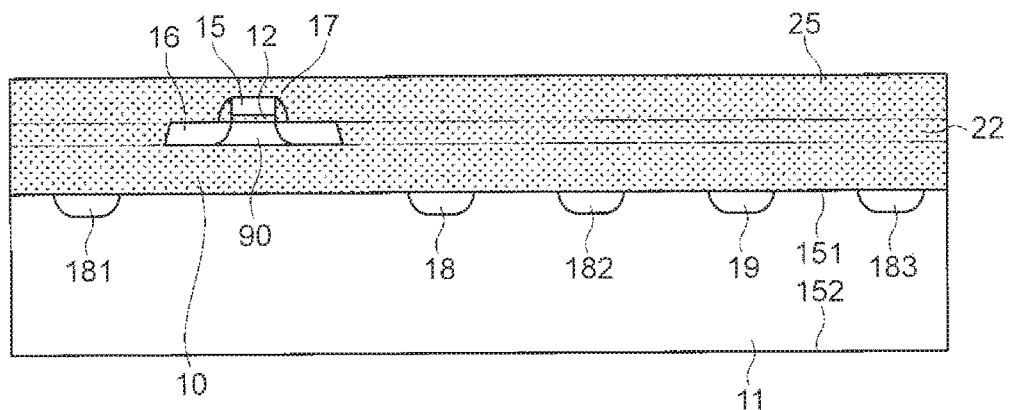
FIG. 7 is a schematic vertical sectional view No. 5 showing the manufacturing process of the semiconductor device according to the first embodiment of the present invention.

In the next step, an impurity 31P+ (phosphorous), for example, is implanted into the N-type drawing out electrode region 181 constituting the second substrate contact portion 50, and the N-type drawing out electrode region 181 and the N-type drawing out electrode region 183 constituting the first substrate contact portion 42 and the first substrate contact portion 44 as the cathode of the diode 46 and the diode 48 at an implantation energy of 60 keV and a dose amount of $5.0 \times 10^{15}$ $cm^{-2}$. As a result, as shown in FIG. 7, the N-type drawing out electrode region 181, the N-type drawing out electrode region 182, and the N-type drawing out electrode region 183 are formed in the N-type semiconductor layer 11.

In the next step, an impurity 11P+(boron), for example, is implanted into a region for forming the P-type drawing out electrode region 18 and the P-type drawing out electrode region 19 as the anode of the diode 46 and the diode 48 at an implantation energy of 40 keV and a dose amount of $5.0 \times 10^{15}$ $cm^{-2}$. As a result, as shown in FIG. 7, the P-type drawing out electrode region 18 and the P-type drawing out electrode region 19 are formed in the N-type semiconductor layer 11. After the P-type drawing out electrode region 18, the P-type drawing out electrode region 19, the N-type drawing out electrode region 181, the N-type drawing out electrode region 182, and the N-type drawing out electrode region 183 are formed, as shown in FIG. 7, a CVD film is deposited on the field oxide film 22 to form the interlayer film 25.

Figure 8:
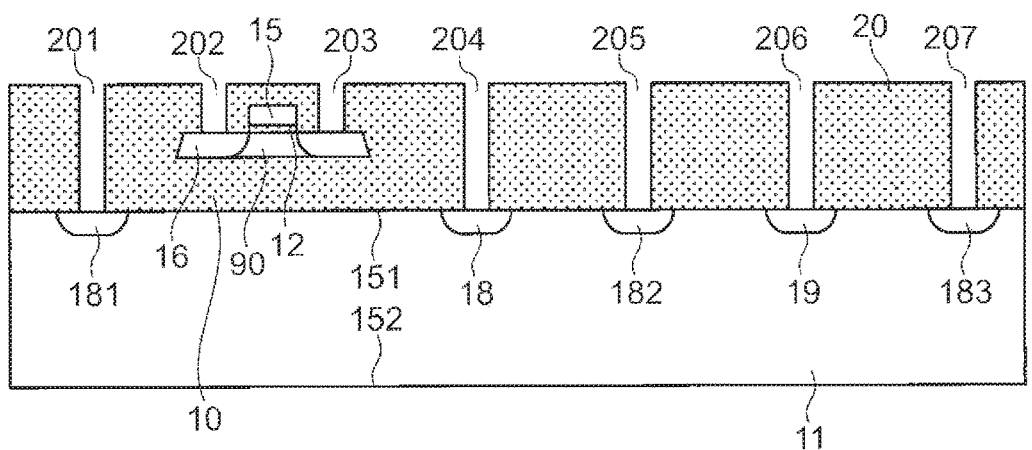
FIG. 8 is a schematic vertical sectional view No. 6 showing the manufacturing process of the semiconductor device according to the first embodiment of the present invention.

In the next step, a photo resist is patterned on the interlayer film 25 to cover a region thereof other than a region corresponding to the first via 222 and the first via 223 of the MOS-type transistor 40; the first conductive member 242; the first conductive member 243; the first via 221, the first via 224, the first via 225, the first via 226, and the first via 227 of the N-type semiconductor layer 11; the first conductive member 241; the first conductive member 245; the first conductive member 246; and the first conductive member 247. Then, the field oxide film 22 and the N-type semiconductor layer 11 are etched with the photo resist as a mask, and the photo resist is removed. Accordingly, as shown in FIG. 8, first contact holes 201, 202, 203, 204, 205, 206, and 207 are formed in the interlayer film 25, the field oxide film 22, and the embedded oxide film 10. Further, a metal such as tungsten (W) is filled in the first contact holes 201, 202, 203, 204, 205, 206, and 207 through CVD and the like. Accordingly, as shown in FIG. 9, the first via 221, the first via 222, the first via 223, the first via 224, the first via 225, the first via 226, and the first via 227 are formed.

Figure 9:
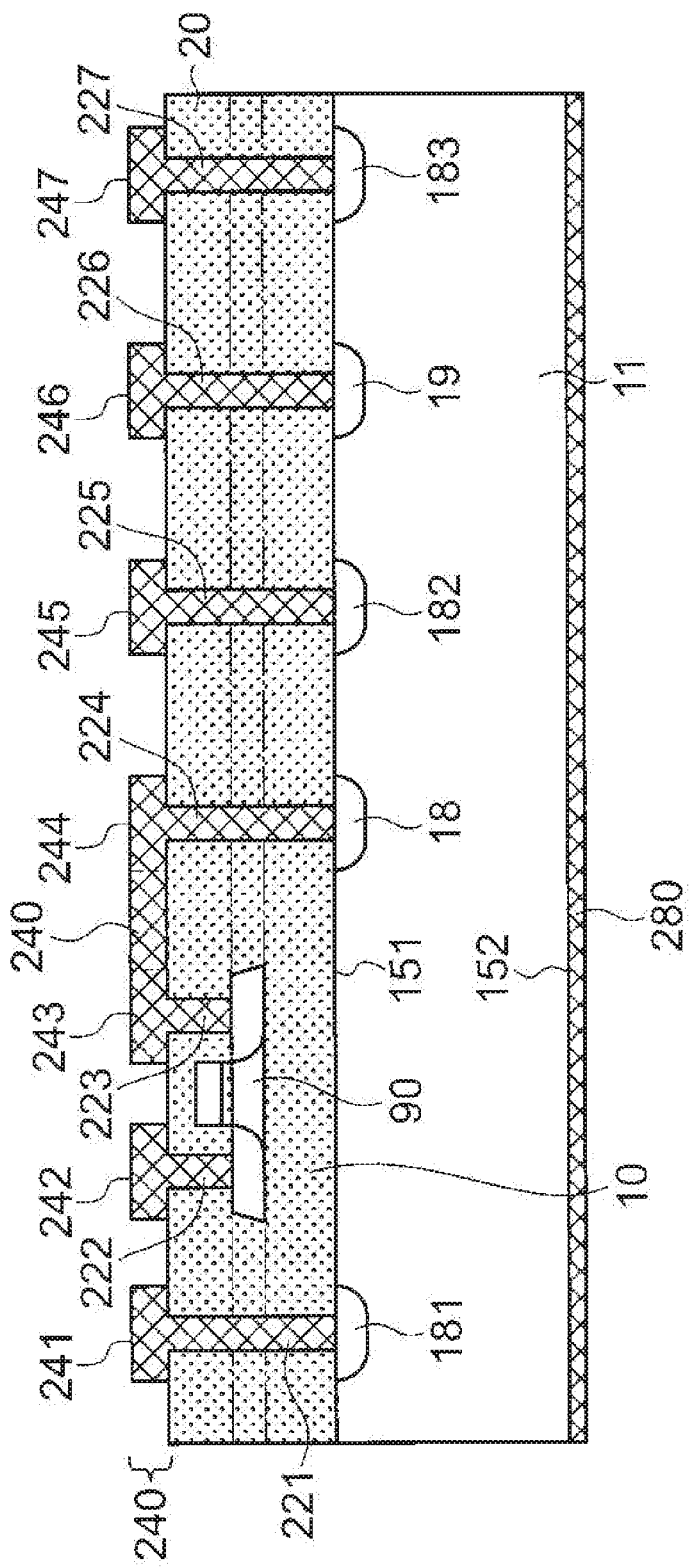
FIG. 9 is a schematic vertical sectional view No. 7 showing the manufacturing process of the semiconductor device according to the first embodiment of the present invention.

In the next step, the metal layer formed on the insulation film 20 through CVD is etched to form the first conductive member 241, the first conductive member 242, the first conductive member 243, the first conductive member 244, the first conductive member 245, the first conductive member 246, and the first conductive member 247 as shown in FIG. 9. The metal for forming the first conductive members may include, for example, aluminum (Al). Afterward, the backside electrode 280 is formed on the main surface 152 of the N-type semiconductor layer 11 using aluminum (Al).

Figure 10:
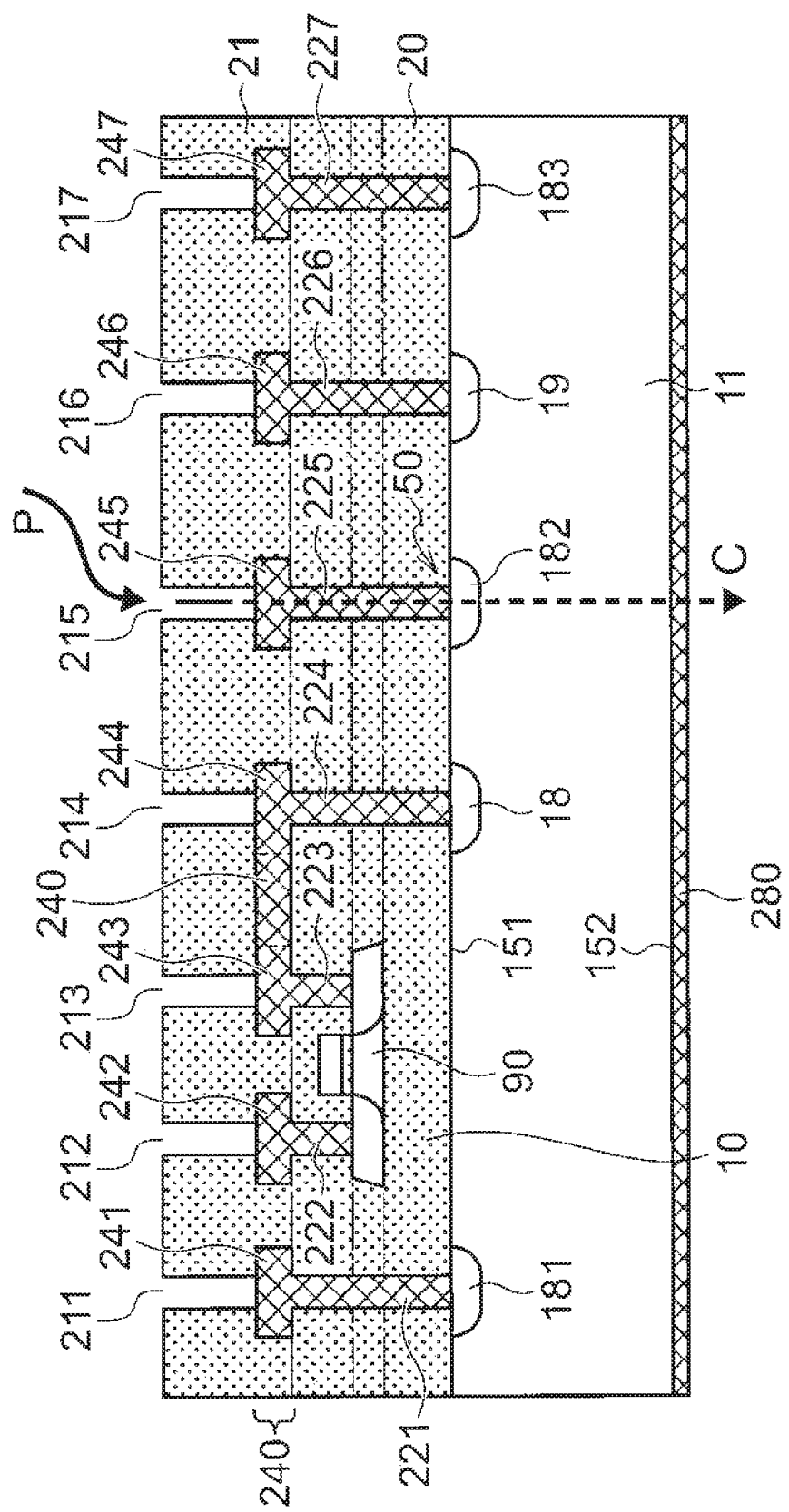
FIG. 10 is a schematic vertical sectional view No. 8 showing the manufacturing process of the semiconductor device according to the first embodiment of the present invention.

In the next step, the CVD film is deposited again on the insulation film 20 to form the interlayer insulation film 21. Then, the photo resist is patterned on the interlayer insulation film 21 in a region other than a region for forming the second conductive members connected to the first conductive members. Afterward, the interlayer insulation film 21 was etched with the photo resist as a mask, and the photo resist is removed. Accordingly, as shown in FIG. 10, second contact holes 211, 212, 213, 214, 215, 216, and 217 are formed in the interlayer insulation film 21. Further, a metal such as tungsten (W) is filled in the second contact holes 211, 212, 213, 214, 215, 216, and 217 through CVD and the like. Accordingly, as shown in FIG. 11, the second via 231, the second via 232, the second via 233, the second via 234, the second via 235, the second via 236, and the second via 237 are formed.

Figure 11:
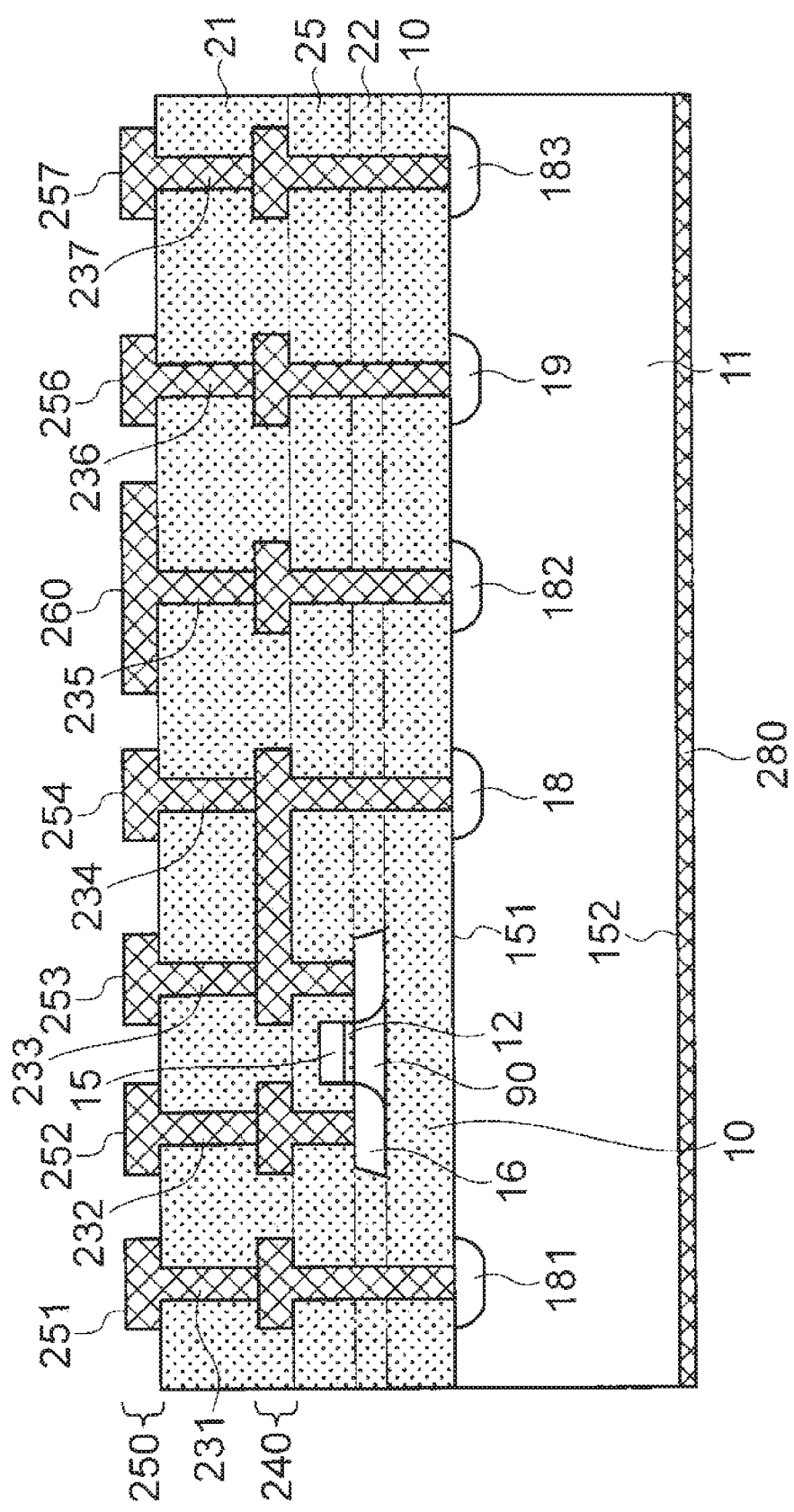
FIG. 11 is a schematic vertical sectional view No. 9 showing the manufacturing process of the semiconductor device according to the first embodiment of the present invention.

In the next step, the metal layer formed on the interlayer insulation film 21 through CVD is etched to form the second conductive member 251, the second conductive member 252, the second conductive member 253, the second conductive member 254, the second conductive member 256, the second conductive member 257, and the electrode 260 as shown in FIG. 11. The metal for forming the second conductive member 251, the second conductive member 252, the second conductive member 253, the second conductive member 254, the second conductive member 256, the second conductive member 257, and the electrode 260 may include, for example, aluminum (Al).

In each step of the manufacturing process described above for producing the semiconductor device 100 according to the first embodiment, the first via 225, the first conductive member 245, the second via 235, and the electrode 260 constituting the second substrate contact portion 50 are not connected to any other vias or conductive members, so that the second substrate contact portion 50 is configured to be the floating electrode.

In the manufacturing process described above for producing the semiconductor device 100 according to the first embodiment, for example, in the plasma etching process shown in FIG. 10, after the second contact holes 211, 212, 213, 214, 215, 216, and 217 are formed through etching, even if plasma is generated as indicated with a solid line arrow P shown in FIG. 10, it is possible to escape charges due to the plasma as indicated with a broken line arrow C shown in FIG. 10 from a metal stage on which a wafer of the semiconductor device 100 is placed through the second substrate contact portion 50 and the backside electrode 280. Accordingly, it is possible to prevent the wafer of the semiconductor device 100 from being damaged during the manufacturing process thereof.

In the first embodiment, it should be noted that the backside electrode 280 is not necessarily provided for escaping charges caused by the plasma. Accordingly, it is not necessary to form the backside electrode 280 in the step shown in FIG. 9. Further, the backside electrode 280 may be formed in the step shown in FIG. 11, or the backside electrode 280 may not be formed after all. In the semiconductor device 100, the N-type semiconductor layer 11 is formed of the conductive material. Accordingly, even when the backside electrode 280 is not formed in the semiconductor device 100, it is possible to escape charges due to the plasma.

Further, in the first embodiment, even if a lightning occurs during the manufacturing process of the semiconductor device 100, it is possible to escape the surge electrical current due to the lightning to the backside surface of the SOI substrate through the second substrate contact portion 50 as indicated with the broken line arrow C shown in FIG. 10. Accordingly, it is possible to prevent the wafer of the semiconductor device 100 from being damaged due to the lightning during the manufacturing process.

In the first embodiment, the semiconductor device 100 includes the two wiring layers. The present invention is not limited thereto, and the semiconductor device 100 may includes any number of the wiring layers. When the semiconductor device 100 includes more than two wiring layers, it is possible to formed the wiring layers through repeating the steps of forming the interlayer insulation film, forming the vias, and forming the conductive members shown in FIGS. 10 and 11. When the semiconductor device 100 includes a large number of the wiring layers, it tends to increase the risk of charges due to the plasma during the plasma etching or the surge electrical current due to the lightning. Accordingly, the effect of the semiconductor device 100 of the present invention becomes more evident.

In the first embodiment, the second conductive members are formed on all of the first conductive members (refer to FIG. 11). The present invention is not limited thereto. It is possible to selectively form the second conductive members on specific ones of the first conductive members that are necessary to be connected.

As explained above, in the semiconductor device 100 according to the first embodiment of the present invention, it is possible to provide the semiconductor device 100, the method of producing the semiconductor device 100, and the electric device system including the semiconductor device 100 capable of preventing damage due to the external charge while suppressing the waste leak electrical current.

Second Embodiment

Figure 12:
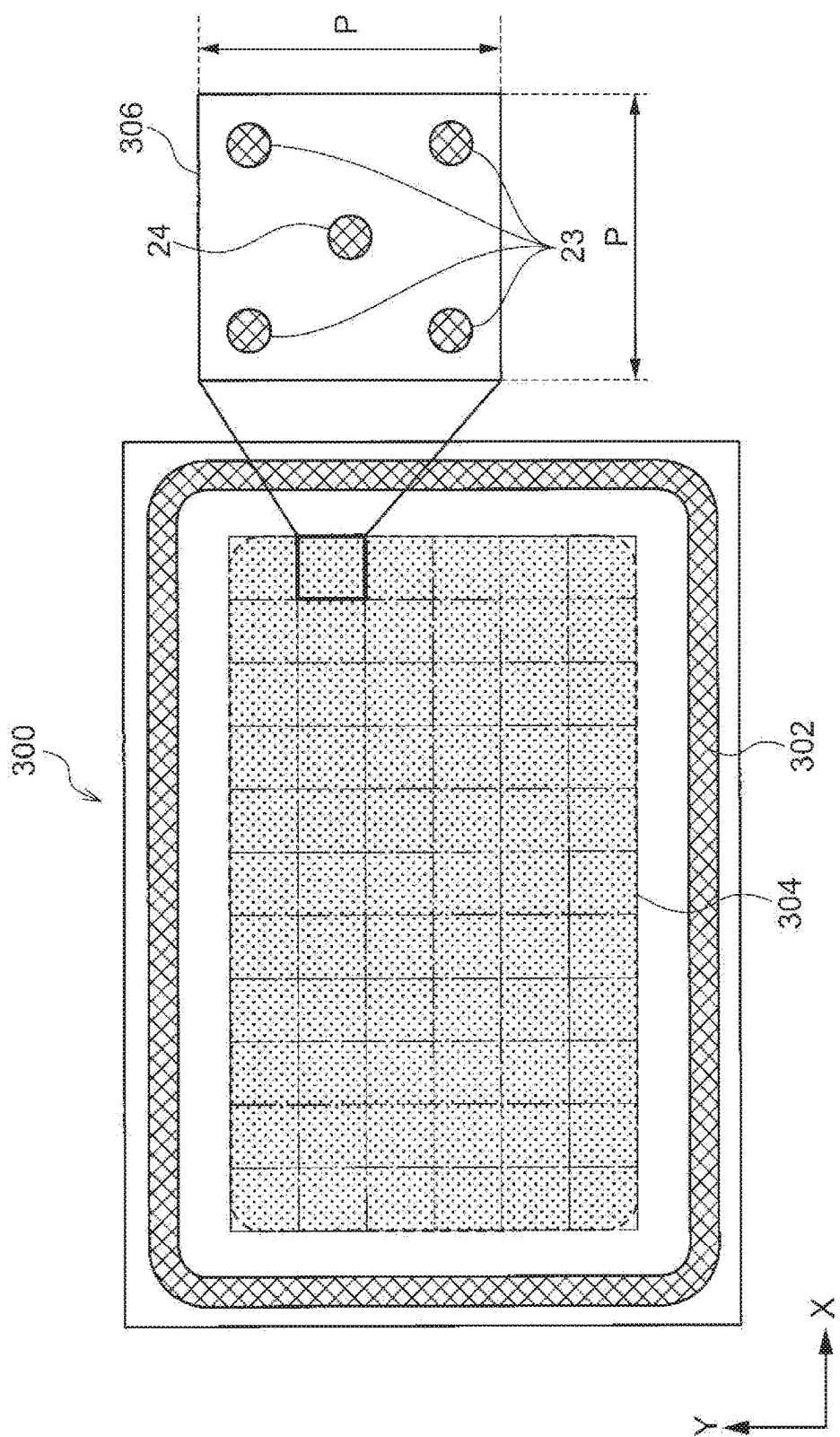
FIG. 12 is a schematic plan view showing a configuration of a semiconductor device according to a second embodiment of the present invention.

A second embodiment of the present invention will be explained next with reference to FIG. 12. FIG. 12 is a schematic plan view showing a configuration of a semiconductor device 300 according to the second embodiment of the present invention.

As shown in FIG. 12, the semiconductor device 300 includes a plurality of single pixel circuits 306 arranged in an array pattern. Each of the single pixel circuits 306 includes the MOS-type transistor 40, the diode 46, and the diode 48 similar to those in the first embodiment.

More specifically, as shown in FIG. 12, the single pixel circuits 306 are repeatedly arranged in a first substrate contact portion 302 in an X direction and a Y direction with a pitch P of 10 µm to 50 µm, thereby constituting an X-ray sensor pixel portion 304. Each of the single pixel circuits 306 includes a plurality of diodes 23 (four diodes 23 are shown in FIG. 12) as a plurality of pixels. Further, each of the single pixel circuits 306 includes a second substrate contact portion 24 (the floating electrode) disposed substantially at the center thereof.

In the second embodiment, the semiconductor device 300 has the configuration described above, so that the second substrate contact portions 24 are arranged with the same interval as the single pixel circuits 306. Accordingly, over the entire surface of the semiconductor device 300, or the entire surface of the wafer during the manufacturing process of the semiconductor device 300, the second substrate contact portions 24 are uniformly arranged. As a result, it is possible to more efficiently escape charges due to the plasma during the plasma etching or the surge electrical current due to the lightning.

Third Embodiment

Figure 13:
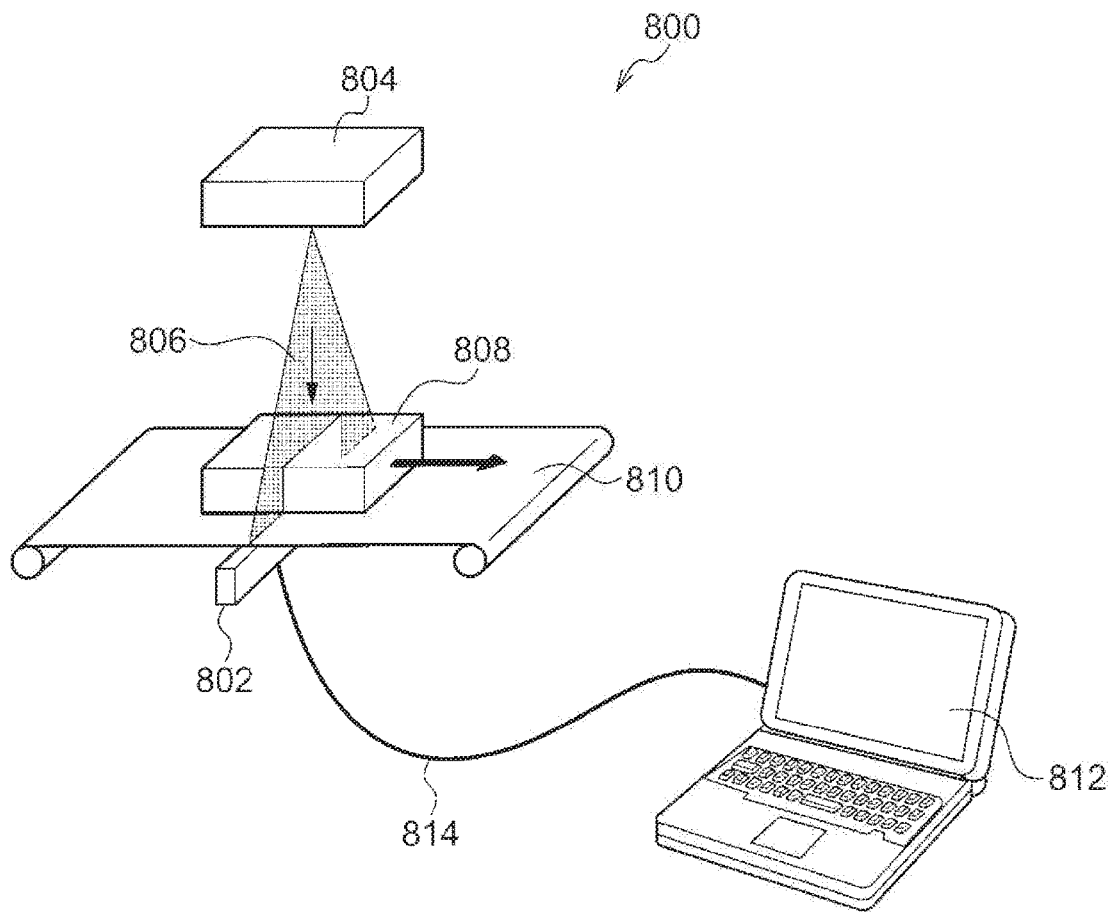
FIG. 13 is a schematic plan view showing a radiographic X-ray equipment according to a third embodiment of the present invention.
Figure 14:
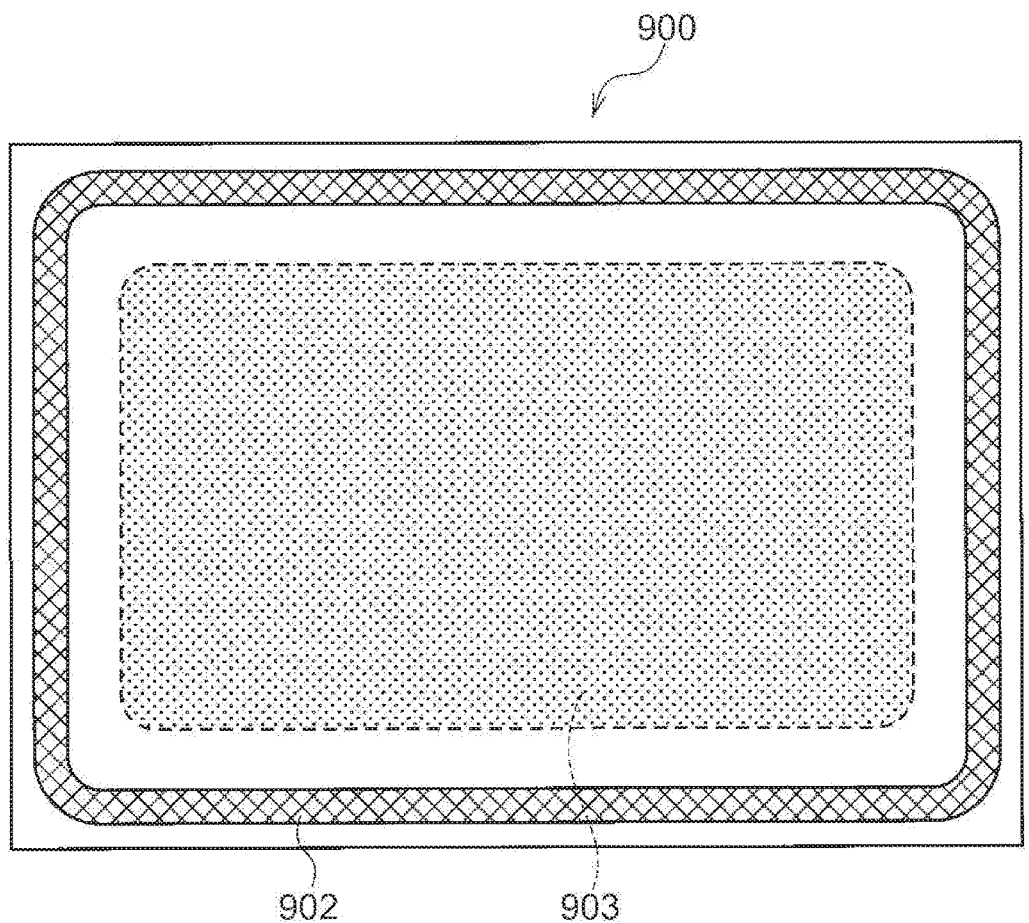
FIG. 14 is a schematic plan view showing an example of a configuration of a conventional semiconductor device.
Figure 15:
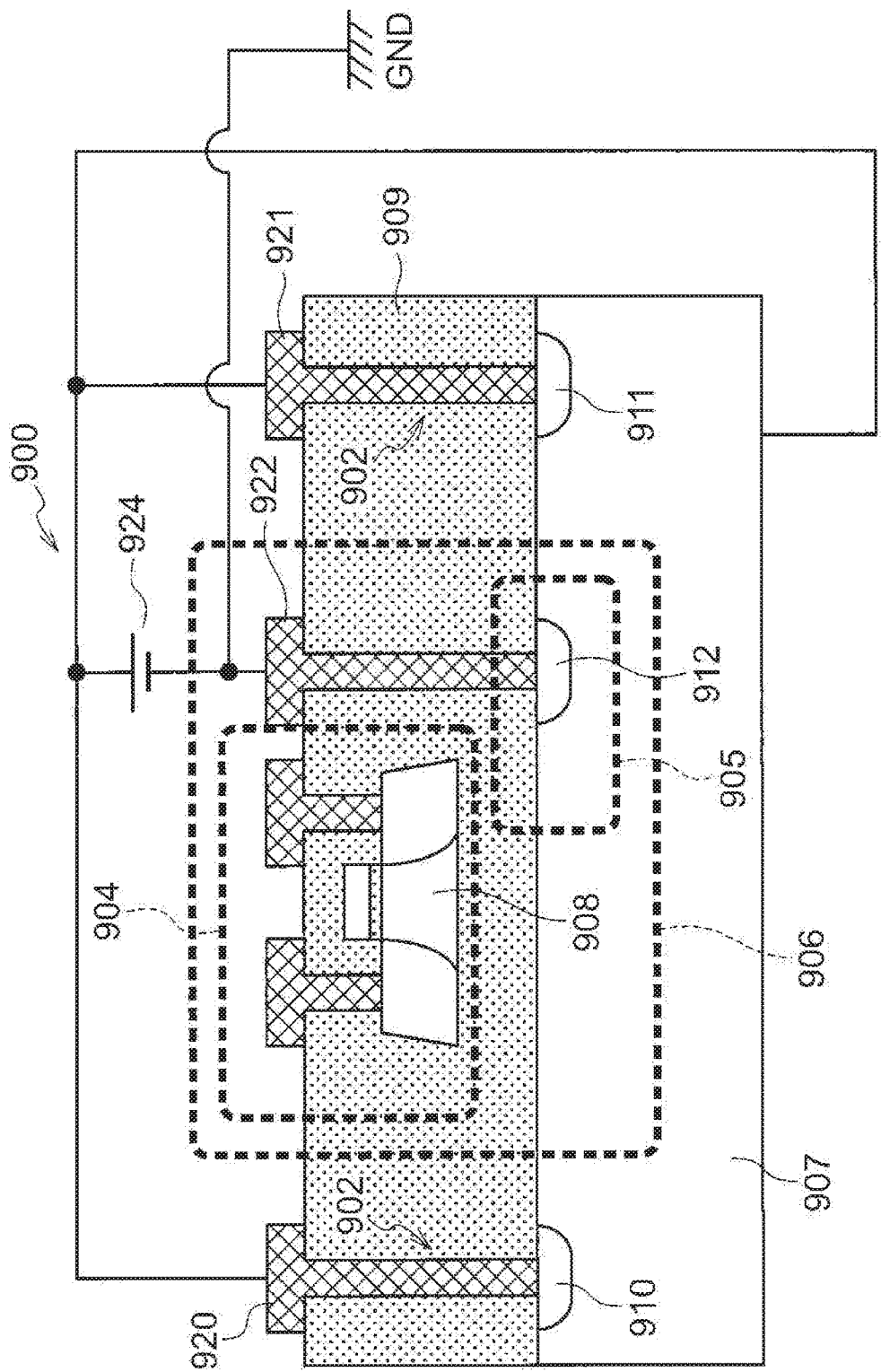
FIG. 15 is a schematic vertical sectional view showing the example of the configuration of the conventional semiconductor device.

A third embodiment of the present invention will be explained next with reference to FIG. 13. FIG. 13 is a schematic plan view showing a radiographic X-ray equipment having the semiconductor device 100 according to the third embodiment of the present invention. It should be noted that the semiconductor device 100 described above is capable of being applied to various radiographic X-ray systems such as a food radiographic X-ray detection system, a mammography system, a dental radiographic X-ray detection system, and the like. In the third embodiment shown in FIG. 13, the semiconductor device 100 is applied to a food radiographic X-ray detection system 800.

As shown in FIG. 13, the food radiographic X-ray detection system 800 includes an X-ray sensor 802; an X-ray source 804; a conveyor belt 801; and a PC (Personal Computer) 812. The X-ray sensor 802 includes the semiconductor device 100 in the first embodiment. More specifically, the X-ray sensor 802 may be formed of a line sensor, in which the semiconductor device 100 is arranged in line. The X-ray source 804 may be formed of an X-ray tube to generate X-rays 806. The PC 812 is configured to process an image generated with the X-ray sensor 802.

In the food radiographic X-ray detection system 800, the conveyor belt 801 transports a food covered with a wrapping as a detection object 808. Then, the X-ray source 804 irradiates the X-rays 806 on the detection object 808, so that the X-ray sensor 802 detects a transmission level of the X-rays 806 thus irradiated. Afterward, the X-ray sensor 802 transmits a signal of the transmission level thus detected to the PC 812, so that the PC 812 performs the image processing. Accordingly, it is possible to detect a metal piece and the like contained in the detection object 808.

As described above, in the third embodiment, the food radiographic X-ray detection system 800 includes the semiconductor device 100 in the first embodiment. Accordingly, when the food radiographic X-ray detection system 800 is operated and the semiconductor device 100 is in the operating state, it is possible to prevent the waste leak electrical current between the second substrate contact portion 50 and the first substrate contact portion 42 or the first substrate contact portion 44, or due to the breakdown between the second substrate contact portion 50 and the diode 46 or the diode 48.

In the third embodiment, the food radiographic X-ray detection system 800 includes the semiconductor device 100 in the first embodiment. Alternatively, the food radiographic X-ray detection system 800 may includes the semiconductor device 300 in the second embodiment to obtain the similar effect.

In the first to third embodiments described above, the semiconductor device 100 or the semiconductor device 300 is provided with the N-type semiconductor layer 11 as the semiconductor substrate. The present invention is not limited thereto, and the semiconductor device 100 or the semiconductor device 300 may be provided with a P-type semiconductor layer as the semiconductor substrate. In this case, the P-type is switched to the N-type, and vise versa.

Further, in the first to third embodiments described above, the semiconductor device 100 or the semiconductor device 300 includes the MOS-type transistor 40 as the periphery circuit element. The present invention is not limited thereto, and the semiconductor device 100 or the semiconductor device 300 may include a diode, a resistor, a capacitor, and the like.

The disclosure of Japanese Patent Application No. 2013-025559, filed on Feb. 13, 2013, is incorporated in the application by reference.

While the invention has been explained with reference to the specific embodiments of the invention, the explanation is illustrative and the invention is limited only by the appended claims.

What is claimed is:

1. A semiconductor device, comprising:
    an SOI (Silicon On Insulation) substrate formed of a first semiconductor layer having a first conductive type, an embedded oxide film, and a circuit layer; and
    an interlayer insulation film formed on the SOI substrate,
    wherein said SOI substrate has a circuit element region and an outer circumferential region surrounding the circuit element region in a plane view,
    said circuit layer includes a plurality of single pixel circuits arranged in an array pattern,
    each of said single pixel circuits includes a circuit element, a diode, and a conductive portion,
    said circuit element is formed on the circuit layer,
    said diode includes a first region formed on the first semiconductor layer and a first conductive member formed on the interlayer insulation film and electrically connected to the first region,
    said first region has a second conductive type different from the first conductive type,
    said conductive portion is electrically isolated from other elements, said conductive portion includes a second region formed on the first semiconductor layer and an electrode formed on the interlayer insulation film and electrically connected to the second region, said second region is arranged at a center of each of the single pixel in the plane view, and said second region has the first conductive type.

2. The semiconductor device according to claim 1, wherein said SOI substrate further includes a substrate contact portion formed in a ring shape and disposed in the outer circumferential region, said substrate contact portion includes a third region formed on the first semiconductor layer and a second conductive member formed on the interlayer insulation film and electrically connected to the third region, and said third region has the first conductive type.

3. The semiconductor device according to claim 1, Wherein said first conductive member is connected to the first region through a via passing through the embedded oxide film and the interlayer insulation film, and said electrode is connected to the second region through a through conductive member passing through the embedded oxide film and the interlayer insulation film.

4. The semiconductor device according to claim 1, wherein each of said single pixel circuits is formed in a substantially rectangular shape, and said diode is disposed at a corner of the substantially rectangular shape.

* * * * *